(12) United States Patent
Jang et al.

(10) Patent No.: US 8,586,968 B2
(45) Date of Patent: Nov. 19, 2013

(54) ORGANIC LIGHT EMITTING DIODE HAVING HIGH EFFICIENCY AND PROCESS FOR FABRICATING THE SAME

(75) Inventors: Jun-Gi Jang, Daejeon (KR); Chang-Hwan Kim, Jeju-si (KR); Dong-Seob Jeong, Seoul (KR); Sang-Young Jeon, Daejeon (KR); Kong-Kyeom Kim, Daejeon (KR); Wook-Dong Cho, Daejeon (KR); Ji-Eun Kim, Daejeon (KR); Byung-Sun Jeon, Seoul (KR)

(73) Assignee: LG Chem, Ltd., Seoul (KR)

( * ) Notice: Subject to any disclaimer, the term of this patent is extended or adjusted under 35 U.S.C. 154(b) by 889 days.

(21) Appl. No.: 12/225,096

(22) PCT Filed: Mar. 14, 2007

(86) PCT No.: PCT/KR2007/001245
§ 371 (c)(1),
(2), (4) Date: Sep. 12, 2008

(87) PCT Pub. No.: WO2007/105906
PCT Pub. Date: Sep. 20, 2007

(65) Prior Publication Data
US 2010/0289008 A1  Nov. 18, 2010

(30) Foreign Application Priority Data
Mar. 14, 2006  (KR) .................. 10-2006-0023608

(51) Int. Cl.
*H01L 51/05* (2006.01)
*H01L 51/30* (2006.01)
*H01L 51/50* (2006.01)
(52) U.S. Cl.
USPC ................ 257/40; 257/30; 257/98

(58) Field of Classification Search
USPC ......... 257/30, 40, 98; 428/690, 691, 704, 917
See application file for complete search history.

(56) References Cited

U.S. PATENT DOCUMENTS 5,093,698 A   3/1992   Egusa
6,252,246 B1  6/2001   Arai et al.
(Continued)

FOREIGN PATENT DOCUMENTS

EP   1 524 706 A3   4/2005
EP   15424706 A2    4/2005
(Continued)

OTHER PUBLICATIONS

Tang, C.W, et al.: Title: "Organic electroluminescent diodes"; received May 12, 1987; accepted for publication Jul. 20, 1987; Applied Physics Letters 51, p. 913, 1987.
(Continued)

*Primary Examiner* — Zandra Smith
*Assistant Examiner* — Tsz Chiu
(74) *Attorney, Agent, or Firm* — McKenna, Long & Aldridge, LLP

(57) ABSTRACT

The present invention provides an organic light emitting device comprising a first electrode, a second electrode, and at least two organic material layers interposed therebetween, including a light emitting layer, wherein the organic material layers comprise at least one layer of a hole injecting layer, a hole transporting layer and a hole injecting and transporting layer, and at least one of the hole injecting layer, the hole transporting layer and the hole injecting and transporting layer comprises a material with a HOMO energy level of −4 eV or less, and a material with a LUMO energy level of −4 eV or less, and a process for preparing the same.

18 Claims, 1 Drawing Sheet

(56) References Cited

U.S. PATENT DOCUMENTS

| | | |
|---|---|---|
| 6,420,031 B1 * | 7/2002 | Parthasarathy et al. ..... 428/411.1 |
| 6,524,727 B1 | 2/2003 | Kathirgamanathan |
| 6,573,651 B2 | 6/2003 | Adachi et al. |
| 6,597,012 B2 * | 7/2003 | Kido et al. ................. 257/40 |
| 6,982,179 B2 | 1/2006 | Kwong et al. |
| 2001/0053463 A1 * | 12/2001 | Thompson et al. ............ 428/690 |
| 2002/0176992 A1 * | 11/2002 | Parthasarathy et al. ..... 428/411.1 |
| 2003/0006411 A1 * | 1/2003 | Kido et al. ................. 257/40 |
| 2004/0219390 A1 * | 11/2004 | Potrawa et al. ............... 428/690 |
| 2005/0084712 A1 | 4/2005 | Kido et al. |
| 2005/0100760 A1 | 5/2005 | Yokoyama |
| 2005/0110005 A1 * | 5/2005 | Forrest et al. ................ 257/40 |
| 2005/0179370 A1 * | 8/2005 | Nakayama et al. ........... 313/504 |
| 2005/0221121 A1 | 10/2005 | Ishihara et al. |
| 2005/0255334 A1 * | 11/2005 | Kang et al. ................. 428/690 |
| 2005/0274961 A1 | 12/2005 | Iou |
| 2006/0046082 A1 * | 3/2006 | Kumazawa et al. .......... 428/458 |
| 2006/0261333 A1 | 11/2006 | Murakami et al. |
| 2006/0289882 A1 | 12/2006 | Nishimura et al. |
| 2007/0278455 A1 * | 12/2007 | Park et al. ................. 252/500 |
| 2007/0290195 A1 * | 12/2007 | Forrest ........................ 257/40 |
| 2010/0026176 A1 * | 2/2010 | Blochwitz-Nomith et al. ............... 313/504 |
| 2010/0203663 A1 * | 8/2010 | Hotta et al. ................. 438/34 |

FOREIGN PATENT DOCUMENTS

| | | |
|---|---|---|
| EP | 1 351 558 B1 | 7/2006 |
| JP | 2000-196140 | 7/2000 |
| JP | 2000-294375 A | 10/2000 |
| JP | 2004-119074 A | 4/2004 |
| JP | 2005-285708 A | 10/2005 |
| JP | 2006-049393 A | 2/2006 |
| JP | 2006-324536 | 11/2006 |
| JP | 2007-208102 | 8/2007 |
| WO | WO 01/67825 A1 | 9/2001 |

OTHER PUBLICATIONS

Blochwitz, J., et al.: Title: "Low voltage organic light emitting diodes featuring doped phthalocyanine as hole transport material"; Applied Physics Letters 73, p. 729-731, 1998.

Yamamori, Asuka, et al.: Title: "Doped organic light emitting diodes having a 650-nm-thick hole transport layer"; Applied Physics Letters, 72, p. 2147-2149, 1998.

Liao, Chi-Hung, et al.: Title: "Highly efficient blue organic light-emitting devices incorporating a composite hole transport layer"; Applied Physics Letter 86, 203507, 2005.

Gufeng He et al.: "High-efficiency and low-voltage p-i-n. electrophosphorescent OLEDs with double-doping emission layers" Proceedings of the International Society for Optical Engineering (SPIE), SPIE, USA, vol. 5464, No. 1, Jan. 1, 2004, pp. 26-31, XP002356312.

Zhou et al. "Low-voltage inverted transparent vacuum deposited organic light-emitting diodes using electrical doping", Applied Physics Letters, vol. 81, No. 5, Jul. 29, 2002,, pp. 922-924.

* cited by examiner

| 1 |
|---|
| 2 |
| 3 |
| 4 |
| 5 |
| 6 |
| 7 | es # ORGANIC LIGHT EMITTING DIODE HAVING HIGH EFFICIENCY AND PROCESS FOR FABRICATING THE SAME

This application is a 371 national stage entry of International Application No. PCT/KR2007/001245, filed on Mar. 14, 2007 that claims priority to Korean Patent Application No. 10-2006-0023608, filed on Mar. 14, 2006, both of which are hereby incorporated by reference in their entirety.

TECHNICAL FIELD

The present invention relates to an organic light emitting device having high efficiency, and a process for preparing the same. Specifically, the present invention relates to an organic light emitting device having high efficiency, in which a material with a low LUMO energy level is incorporated in a hole injecting and/or transporting layer, and to a process for preparing the same.

This application claims priority benefits from Korean Patent Application No. 10-2006-0023608, filed on Mar. 14, 2006, the entire contents of which are fully incorporated herein by reference.

BACKGROUND ART

The organic light emitting device is an electronic device which emits light through the current by an applied voltage. Tang et al. report an organic light emitting device having good characteristics [Applied Physics Letters 51, p. 913, 1987]. Further, an organic light emitting device using a polymeric material, which employs the structure of the organic light emitting device as disclosed in this document, has ever been developed.

The essential point of the prior art is that the organic material layers in the organic light emitting device play their own roles in the processes for light emission, i.e. charge injection, charge transport, exciton formation, and light generation, respectively. Therefore, in recent years, an organic light emitting device comprising an anode (7), a hole injecting layer (6), a hole transporting layer (5), a light emitting layer (4), an electron transporting layer (3), an electron injecting layer (2), and a cathode (1), as illustrated in FIG. 1, or other organic light emitting devices having a more complex structure comprising additional layers is used.

Studies on doping various materials for improving the conductivity of the organic material for a hole injecting layer, a hole transporting layer, an electron transporting layer, and an electron injecting layer in the organic light emitting device have been conducted. See, Japanese Patent Application Publication No. 2000-196140, [Applied Physics Letters, 73, p. 729-731 (1998)], [Applied Physics Letters, 72, pp. 2147-2149 (1998)], U.S. Pat. No. 5,093,698, and International Patent Application Publication WO 01/67825.

The above documents proposed embodiments of devices having high efficiency simply by increasing the conductivity of the charge transporting layer or the charge injecting layer through doping. For example, International Patent Application Publication WO 01/67825 describes that the hole conductivity in the case of p-doping with a stable organic molecular material of an acceptor type having a high molecular weight of 200 g/mol or more on a hole transporting layer (at a low doping concentration of 1:110 to 10000) is further increased than those in the case of not applying such the procedure. Similarly, it is also described that by n-doping with a stable organic molecular material of a donor type having a high molecular weight on an electron transporting layer, the similar results can be obtained.

Meanwhile, in the currently available organic light emitting devices, the efficiency of the devices may have been increased by reducing the conductivity of the hole transporting layer because the degree of electron injection from the electron transporting layer to the light emitting layer is less than that of hole injection from the hole transporting layer to the light emitting layer [Applied Physics letters, 86, 203507, 2005].

However, this document describes that a hole injecting layer having a small energy band gap [copper phthalocyanine (CuPC), HOMO: −5.1 eV, LUMO: −3 eV] is doped on a hole transporting layer having a high energy band gap [N,N'-bis-(1-naphthyl)-N,N'-diphenyl-1,1'-biphenyl-4,4'-diamine (NPB), HOMO: −5.5 eV, LUMO: −2.4 eV]. In these devices, the increase in the efficiency is resulted from increasing the efficiency in proportion to the ratio of the holes and the charges injected to a light emitting layer by trapping the holes using the HOMO (highest occupied molecular orbital) energy level of CuPC.

DISCLOSURE OF INVENTION

Technical Problem

The present inventor have found that an organic light emitting device having high efficiency can be obtained by forming a hole injecting and/or transporting layer of an organic light emitting device using a material with a LUMO energy level of −4 eV or less with a material with a HOMO energy level of −4 eV or less, which is ordinarily used as a hole injecting and/or transporting material.

Technical Solution

Thus, it is an object of the present invention to provide an organic light emitting device, in which the hole injecting and/or transporting layer comprises a material with a HOMO energy level of −4 eV or less and a material with a LUMO energy level of −4 eV or less, and a process for preparing the same.

Advantageous Effects

In the present invention, an organic light emitting device having high efficiency can be prepared by using comprise a material with a LUMO energy level of −4 eV or less, as well as a material with a HOMO energy level of −4 eV or less which is conventionally used as a hole injecting and/or transporting material of the organic light emitting device.

BRIEF DESCRIPTION OF THE DRAWINGS

FIG. 1 is a cross-sectional view illustrating the structure of the organic light emitting device.

REFERENCE NUMERALS

Cathode (1),
Electron injecting layer (2),
Electron transporting layer (3),
Light emitting layer (4),
Hole transporting layer (5),
Hole injecting layer (6), and
Anode (7).

BEST MODE FOR CARRYING OUT THE INVENTION

The present invention provides an organic light emitting device comprising a first electrode, a second electrode, and at least two organic material layers interposed therebetween, including a light emitting layer, wherein the organic material layers comprise at least one layer of a hole injecting layer, a hole transporting layer and a hole injecting and transporting layer, and at least one of the hole injecting layer, the hole transporting layer and the hole injecting and transporting layer comprises both of a material with a HOMO energy level of −4 eV or less, and a material with a LUMO energy level of −4 eV or less.

Further, the present invention provides a process for preparing an organic light emitting device, comprising the steps of:

preparing a first electrode;

forming at least two organic material layers including a light emitting layer on the first electrode; and forming a second electrode on the organic material layer, wherein the step of forming the organic material layer comprises the step of forming at least one layer of a hole injecting layer, a hole transporting layer and a hole injecting and transporting layer, and the step of forming at least one layer of the hole injecting layer, the hole transporting layer and the hole injecting and transporting layer comprises the step of forming a layer using a material with a HOMO energy level of −4 eV or less and a material with a LUMO energy level of −4 eV or less.

Hereinbelow, the present invention will be described in detail.

The present invention may be characterized in that the organic material layers comprise at least one layer of a hole injecting layer, a hole transporting layer and a hole injecting and transporting layer, and these layers comprise a material with a LUMO energy level of −4 eV or less, as well as a material with a HOMO energy level of −4 eV or less which is conventionally used as a hole injecting and/or transporting material.

In the present invention, the HOMO energy level and the LUMO energy level can be determined using an apparatus or a calculation method known in the art. For example, the HOMO energy level can be measured using a UPS (ultra-violet photoemission spectroscopy) or an AC-2 equipment, manufactured by Riken Keiki Co., Ltd. (Japan). Further, the LUMO energy level can be measured using an IPES (inverse photoemission spectroscopy) or calculated by measuring a HOMO energy level and then subtracting an optical band gap from this value.

In the present invention, as the material with a HOMO energy level of −4 eV or less, any one which is conventionally used as a hole injecting or transporting material can be used without any limitation.

Limitation of HOMO energy level is based on contact electrode work function.

Therefore, if the material with HOMO energy level of −4 eV or less is used, a doped material with LUMO energy level of −4 eV or less on the material acts as a charge generation center. Then, the charge at the material with HOMO energy level of −4 eV or less will jump into the material with LUMO energy level of −4 eV or less to leave hole at the material with HOMO energy level of −4 eV or less, thus trapping event will be prior and regulating mobility will be secondary effect.

Further, the HOMO energy level of the material is preferably −9 eV or more. As the hole injecting or transporting material, organic materials containing an amine group are preferably used.

Specific examples of the material with a HOMO energy level of −4 eV or less include N,N'-bis-(1-naphthyl)-N,N'-diphenyl-1,1'-biphenyl-4,4'-diamine (NPB) (−5.5 eV), and N,N'-diphenyl-N,N'-(3-methylphenyl)-1,1'-biphenyl-4,4'-diamine (TPD) (−5.2 eV), but are not limited thereto.

In the present invention, for the material with a LUMO energy level of −4 eV or less, the conductivity of the hole injecting and/or transporting layer in the organic light emitting device can be controlled with the LUMO energy level. Specifically, it seems that since the material with a LUMO energy level of −4 eV or less has a LUMO energy level for trapping the holes of the material with a HOMO energy level of −4 eV or less, it may play a role in reduction in the conductivity of the hole injecting and/or transporting layer, thereby improving the efficiency of the device.

In the present invention, the kind of the material is not particularly limited, as long as it has a LUMO energy level of −4 eV or less. It is more preferable that the material with a LUMO energy level of −4 eV or less has a LUMO energy level of −5 eV or less. Further, it is more preferable that the material has a LUMO energy level of −9 eV or more. If the material has a LUMO energy level within the above-described range, it is in balance with a material with a HOMO energy level of −4 eV or less, and the efficiency of the device can be further improved by suitably reducing the conductivity of the hole injecting and/or transporting layer.

Specific examples of the material include 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalenetetracarboxylic dianhydride (NTCDA), fluorine-substituted NTCDA, cyano-substituted NTCDA, hexanitrile hexaazatriphenylene (HAT), and hex aazatriphenylene hexacarbonnitrile, but are not limited thereto.

In the organic light emitting device of the present invention, the ratio of the material with a HOMO energy level of −4 eV or less and the material with a LUMO energy level of −4 eV or less in the hole injecting and/or transporting layer is not particularly limited, but two materials can be used at a ratio which leads to a higher drive voltage than the drive voltage in the case of each material alone. This mixing ratio can be selected according to the kind of the material to be used, the conditions for manufacturing or driving the device, or the like by a skilled person in the art. For example, in the case of using NPB as a material with a HOMO energy level of −4 eV or less, hexaazatriphenylene hexacarbonnitrile can be mixed in a proportion ranging from 20 vol % to 80 vol % as a material with a LUMO energy level of −4 eV or less.

The method for forming a hole injecting and/or transporting layer using a material with a HOMO energy level of −4 eV or less and a material with a LUMO energy level of −4 eV or less layer is not particularly limited, and any method known in the art can be employed. For example, the hole injecting and/or transporting layer can be formed by mixing the above-described materials and coating it in a solution process, or depositing the above-described materials together, or by other methods. Examples of the coating method include spin coating, dip coating, doctor blading, screen printing, ink jet printing, and heat transfer processes, but are not limited thereto.

In the organic light emitting device according to the present invention, the thickness of the layer comprising the material with a HOMO energy level of −4 eV or less and the material with a LUMO energy level of −4 eV or less is preferably 1 nm to 100 nm, and more preferably 10 nm to 60 nm.

The organic light emitting device according to the present invention can have a structure known in the art, except that its hole injecting and/or transporting layer comprises a material with a LUMO energy level of −4 eV or less, as well as a material with a HOMO energy level of −4 eV or less which is conventionally used as a hole injecting and/or transporting material.

In the organic light emitting device according to the present invention, the hole injecting and/or transporting layer can further comprise an inorganic material. The inorganic material is preferably a metal or a metal oxide. The work function of the inorganic material is desirably 6 eV or less, and more preferably 2.5 eV or more and 6 eV or less. Examples of the inorganic material having a work function of 6 eV or less include Au(5.1 eV), Pt(5.6 eV), Al(4.2 eV), Ag(4.2 eV), and Li(2.9 eV).

The organic light emitting device according to the present invention has a structure comprising a first electrode, a second electrode and organic material layers interposed therebetween, wherein the organic material layers can comprise only a hole injecting and/or transporting layer and a light emitting layer, or further comprise at least one layer selected from additional organic material layers, such as an electron transporting layer, an electron injecting layer, a hole or electron shielding layer, and a buffer layer.

For example, the organic light emitting device of the present invention may have a structure, in which a substrate, a hole injecting electrode, a hole injecting and/or transporting layer, a light emitting layer, an electron transporting layer and an electron injecting electrode are subsequently laminated. The organic light emitting device having such structure is referred to as an organic light emitting device having a forward structure. However, the present invention is not limited thereto, but it also includes an organic light emitting device having a reverse structure. That is, the organic light emitting device of the present invention can have a structure in which a substrate, an electron injecting electrode, an electron transporting layer, a light emitting layer, a hole injecting and/or transporting layer and a hole injecting electrode are sequentially laminated.

The process for preparing the organic light emitting device according to the present invention comprises the steps of preparing a first electrode; forming at least two organic material layers including a light emitting layer on the first electrode; and forming a second electrode on the organic material layer, wherein the step of forming the organic material layer comprises the step of forming at least one layer of a hole injecting layer, a hole transporting layer and a hole injecting and transporting layer, and the step of forming at least one layer of the hole injecting layer, the hole transporting layer and the hole injecting and transporting layer comprises the step of forming a layer using a material with a HOMO energy level of −4 eV or less and a material with a LUMO energy level of −4 eV or less.

The organic light emitting device according to the present invention can be prepared by usual methods and materials known in the art, except that the hole injecting and/or transporting layer may be formed using a material with a LUMO energy level of −4 eV or less, as well as a material with a HOMO energy level of −4 eV or less which is conventionally used as a hole injecting and/or transporting material.

For example, the organic light emitting device according to the present invention can be prepared by depositing a metal, or a metal oxide having conductivity, or an alloy thereof on a substrate using a PVD (physical vapor deposition) process such as sputtering or e-beam evaporation to form an anode; forming organic material layers on the anode; and depositing a material, which can be used as a cathode, thereon. Alternatively, an organic light emitting device can be prepared by depositing a cathode material, an organic material layer, and an anode material on a substrate, as described above to prepare an organic light emitting device having a reverse structure.

The organic material layer in the organic light emitting device according to the present invention can be produced to have a fewer number of layers, by using a variety of polymeric materials, by means of a solvent process rather than a deposit process, such as spin coating, clip coating, doctor blading, screen printing, ink jet printing, and heat transfer processes.

The hole injecting electrode material in the organic light emitting device according to the present invention may be preferably a material having a large work function to facilitate hole injection usually to the organic material layers. Specific examples of the hole injecting electrode material which can be used in the present invention include metals such as vanadium, chromium, copper, zinc and gold, or an alloy thereof; metal oxides such as zinc oxide, indium oxide, indium-tin oxide (ITO), and indium zinc oxide (IZO); a combination of a metal and an oxide such as $ZnO:Al$ and $SnO_2:Sb$; conductive polymers such as poly(3-methylthiophene), poly[3,4-(ethylene-1,2-dioxy)thiophene] (PEDT), polypyrrole and polyaniline, but are not limited thereto.

The electron injecting electrode material in the organic light emitting device according to the present invention may be preferably a material having a small work function to facilitate electron injection usually to the organic material layers. Specific examples of the cathode material include metals such as magnesium, calcium, sodium, potassium, titanium, indium, yttrium, lithium, gadolinium, aluminum, silver, tin and lead, or an alloy thereof; multilayer structure materials such as LiF/Al and $LiO_2/Al$, but are not limited thereto.

The light emitting material are a material capable of emitting visible light by accepting and recombining holes from the hole transporting layer and electrons from the electron transporting layer, preferably a material having high quantum efficiency for fluorescence or phosphorescence. Specific examples thereof include 8-hydroxyquinoline aluminum complex ($Alq_3$); compounds of carbazole series; dimerized styryl compounds; BAlq; 10-hydroxybenzoquinoline-metal compounds; compounds of benzoxazole, benzthiazole and benzimidazole series; polymers of poly(p-phenylenevinylene) (PPV) series; Spiro compounds; and compounds of polyfluorene and rubrene series, but are not limited thereto.

The electron transporting material may be suitably a material having high electron mobility, which can transfer electrons from the electron injecting electrode) to the light emitting layer. Specific examples thereof include Al complexes of 8-hydroxyquinoline; complexes including $Alq_3$; organic radical compounds; and hydroxyflavone-metal complexes, but are not limited thereto.

MODE FOR THE INVENTION

Hereinafter, the present invention will be described in more detail by means of Examples. The following Examples are provided for exemplifying the invention, and it should not be construed that the scope of the invention is limited thereto.

EXAMPLE 1

A transparent electrode (indium tin oxide) was deposited on a glass substrate to a thickness of 100 nm for a hole injecting electrode, to which heat was applied in vacuo. The compound of the following formula 1 (HOMO: about −5.33 eV) which had been doped with 40 vol % of hexaazatriphenylene hexacarbonnitrile (LUMO: about −5.5 to −6 eV) was deposited thereon to a thickness of 60 nm for a hole injecting and transporting layer. N,N'-bis-(1-naphthyl)-N,N'-diphenyl-1,1'-biphenyl-4,4'-diamine (NPB) was deposited thereon to a thickness of 20 nm for a hole transporting and electron shielding layer. Tris(8-hydroxyquinolino)aluminum ($Alq_3$) and 10-(2-benzothiazolyl)-1,1,7,7-tetramethyl-2,3,6,7-tetrahydro-1H,5H,11H-[1]benzopyrano[6,7,8-ij]-quinolizin-11-one) (C545t) were deposited thereon to a thickness of 25 nm for a light emitting layer. Tris(8-hydroxyquinolino)aluminum ($Alq_3$) was deposited thereon to a thickness of 25 nm for an electron transporting and injecting layer. LiF was deposited thereon to a thickness of 1 nm for an electron injecting layer, and then aluminum (Al) was deposited thereon to a thickness of 150 nm for an electron injecting electrode, thereby preparing an organic light emitting device.

The prepared device had a voltage of 10.97 V and an efficiency of 9.92 cd/A at a current density of 100 mA/cm$^2$.

[Formula 1]

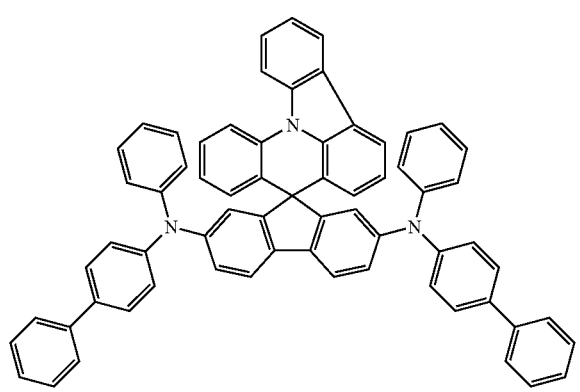

EXAMPLE 2

An organic light emitting device was prepared in the same manner as in Example 1, except that deposition was conducted to give the thickness of the hole injecting and transporting layer of 10 nm, and to give the thickness of the hole transporting and electron shielding layer of 40 nm.

The prepared device had a voltage of 7 V and an efficiency of 9.95 cd/A at a current density of 100 mA/cm$^2$.

EXAMPLE 3

An organic light emitting device was prepared in the same manner as in Example 1, except that NPB (HOMO: about −5.5 eV) which had been doped with 40 vol % of hexaazatriphenylene hexacarbonnitrile was deposited to a thickness of 10 nm for the hole injecting and transporting layer, and deposition was conducted to give the thickness of the hole transporting and electron shielding layer of 30 nm.

The prepared device had a voltage of 7.73 V and an efficiency of 10.11 cd/A at a current density of 100 mA/cm$^2$.

EXAMPLE 4

An organic light emitting device was prepared in the same manner as in Example 1, except that the compound of the following formula 2 (HOMO: about −5.3 eV) which had been doped with 40 vol % of hexaazatriphenylene hexacarbonnitrile was deposited to a thickness of 10 nm for the hole injecting and transporting layer, and deposition was conducted to give the thickness of the hole transporting and electron shielding layer of 30 nm.

[Formula 2]

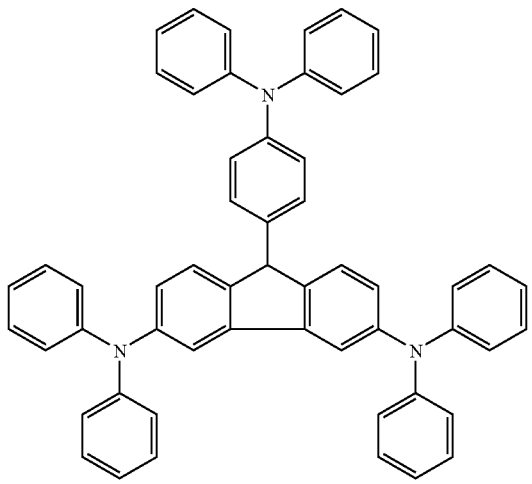

The prepared device had a voltage of 7.2 V and an efficiency of 9.5 cd/A at a current density of 100 mA/cm$^2$.

EXAMPLE 5

An organic light emitting device was prepared in the same manner as in Example 1, except that the compound of the following formula 3 (HOMO: about −5.2 eV) which had been doped with 40 vol % of hexaazatriphenylene hexacarbonnitrile was deposited to a thickness of 10 nm for the hole injecting and transporting layer, and deposition was conducted to give the thickness of the hole transporting and electron shielding layer of 30 nm.

[Formula 3]

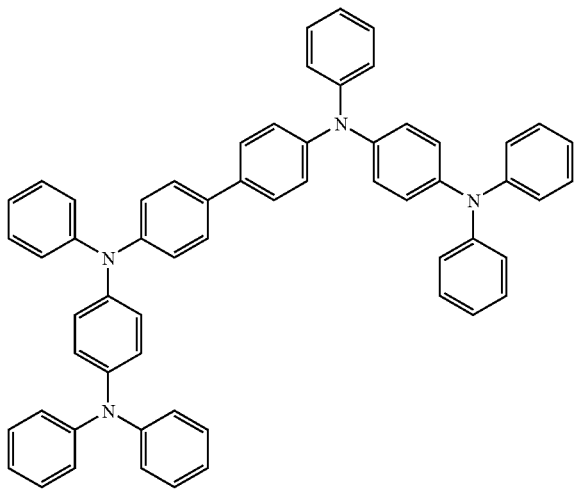

The prepared device had a voltage of 6.9 V and an efficiency of 9.4 cd/A at a current density of 100 mA/cm$^2$.

EXAMPLE 6

An organic light emitting device was prepared in the same manner as in Example 1, except that the compound of the following formula 4 (HOMO: about −5.4 eV) which had been doped with 40 vol % of hexaazatriphenylene hexacarbonnitrile was deposited to a thickness of 10 nm for the hole injecting and transporting layer, and deposition was conducted to give the thickness of the hole transporting and electron shielding layer of 30 nm.

[Formula 4]

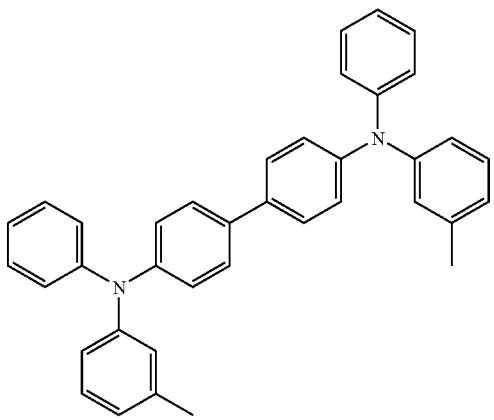

The prepared device had a voltage of 8 V and an efficiency of 10.6 cd/A at a current density of 100 mA/cm$^2$.

EXAMPLE 7

An organic light emitting device was prepared in the same manner as in Example 1, except that the compound of the following formula 5 (HOMO: about −5.4 eV) which had been doped with 40 vol % of hexaazatriphenylene hexacarbonnitrile was deposited to a thickness of 10 nm for the hole injecting and transporting layer, and deposition was conducted to give the thickness of the hole transporting and electron shielding layer of 30 nm.

[Formula 5]

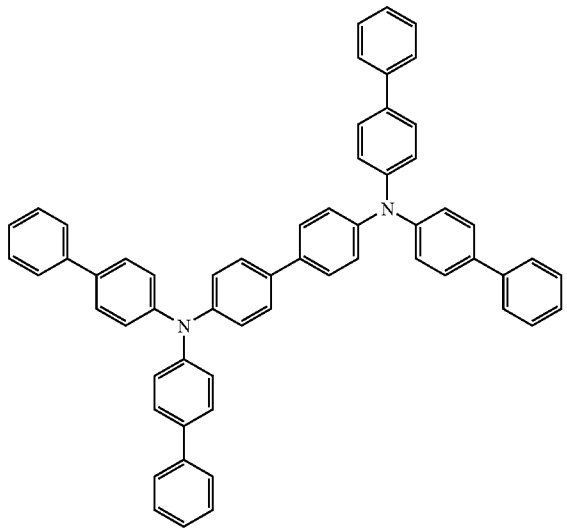

The prepared device had a voltage of 7.4 V and an efficiency of 9.8 cd/A at a current density of 100 mA/cm$^2$.

EXAMPLE 8

An organic light emitting device was prepared in the same manner as in Example 1, except that the NPB material (HOMO: about −5.5 eV) which had been doped with 40 vol % of the compound of the following formula 6 (LUMO: about −5.0 eV to −5.3 eV) was deposited to a thickness of 10 nm for the hole injecting and transporting layer, and deposition was conducted to give the thickness of the hole transporting and electron shielding layer of 30 nm.

[Formula 6]

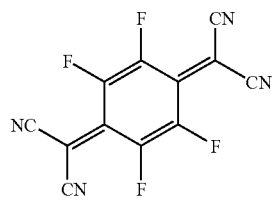

The prepared device had a voltage of 8.4 V and an efficiency of 9.5 cd/A at a current density of 100 mA/cm$^2$.

COMPARATIVE EXAMPLE 1

An organic light emitting device was prepared in the same manner as in Example 1, except that only the compound of the formula 1 was deposited to a thickness of 60 nm for the hole injecting and transporting layer.

The prepared device had a voltage of 6.93 V and an efficiency of 7.74 cd/A at a current density of 100 mA/cm$^2$.

COMPARATIVE EXAMPLE 2

An organic light emitting device was prepared in the same manner as in Example 1, except that only the NPB material was deposited to a thickness of 60 nm for the hole injecting and transporting layer.

The prepared device had a voltage 7.55 V and an efficiency of 8.5 cd/A at a current density of 100 mA/cm$^2$.

COMPARATIVE EXAMPLE 3

An organic light emitting device was prepared in the same manner as in Example 1, except that only hexaazatriphenylene hexacarbonnitrile was deposited to a thickness of 60 nm for the hole injecting and transporting layer.

The prepared device had a voltage 6.3 V and an efficiency of 6.9 cd/A at a current density of 100 mA/cm$^2$.

The results from Examples 1 to 8 confirmed that in the organic light emitting device, if a hole injecting and/or transporting layer is formed by using a material with a HOMO energy level of −4 eV or less and a material with a LUMO energy level of −4 eV or less in combination, a device having good efficiency can be established.

In comparison between the results from Comparative Examples 1 and 3 and the results from Example 1, between the results from Comparative Example 2 and the results from Example 3, the devices of Examples in which the above-mentioned two materials were used as the materials for the hole injecting and/or transporting layer exhibited beneficial characteristics in terms of efficiency, as compared with the devices of Comparative Examples in which only one material was used as the material for hole injecting and transporting layer.

The device of Example 2 exhibited excellent effects in terms of voltage and efficiency, as compared with the device of Comparative Example 1.

The invention claimed is:

1. An organic light emitting device comprising
a first electrode,
a second electrode, and
at least two organic material layers interposed therebetween, including a light emitting layer,
wherein the organic material layers comprise at least one layer of a hole injecting layer, a hole transporting layer and a hole injecting and transporting layer,
wherein the at least one hole injecting layer, hole transporting layer and hole injecting and transporting layer comprises both a material with a HOMO energy level of −4 eV or less, and a material with a LUMO energy level of −4 eV or less,
wherein the material with a HOMO energy level of −4 eV or less and the material with a LUMO energy level of −4 eV or less are mixed in a ratio which leads to a higher drive voltage than the drive voltage in the case of each material alone, and
wherein the thickness of the layer comprising the material with a HOMO energy level of −4 eV or less and the material with a LUMO energy level of −4 eV or less is 10 nm to 60 nm.

2. The organic light emitting device according to claim 1, wherein the material with a HOMO energy level of −4 eV or less includes an organic material containing an amine group.

3. The organic light emitting device according to claim 1, wherein the material with a HOMO energy level of −4 eV or less has a HOMO energy level of −9 eV or more.

4. The organic light emitting device according to claim 1, wherein the material with a LUMO energy level of −4 eV or less has a LUMO energy level of −9 eV or more.

5. The organic light emitting device according to claim 1, wherein the material with a LUMO energy level of −4 eV or less includes at least one selected from the group consisting of 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalenetetracarboxylic dianhydride (NTCDA), fluorine-substituted NTCDA, cyano-substituted NTCDA, hexanitrile hexaazatriphenylene (HAT), and hexaazatriphenylene hexacarbonnitrile.

6. The organic light emitting device according to claim 1, wherein the material with a LUMO energy level of −4 eV or less is hexaazatriphenylene hexacarbonnitrile.

7. The organic light emitting device according to claim 1, wherein at least one layer of the hole injecting layer, the hole transporting layer and the hole injecting and transporting layer comprises an inorganic material and an organic material.

8. The organic light emitting device according to claim 7, wherein the inorganic material is a metal or a metal oxide.

9. The organic light emitting device according to claim 7, wherein the inorganic material has a work function of 2.5 eV or more and 6 eV or less.

10. The organic light emitting device according to claim 1, having a forward structure, in which a hole injecting electrode, at least two organic material layers including a light emitting layer, and an electron injecting electrode are sequentially laminated from the bottom.

11. The organic light emitting device according to claim 1, having a reverse structure, in which an electron injecting electrode, at least two organic material layers including a light emitting layer, and a hole injecting electrode are sequentially laminated from the bottom.

12. The organic light emitting device according to claim 1, wherein the organic material layers comprise at least one layer selected from an electron injecting layer, an electron transporting layer, an electron injecting and transporting layer, an electron shielding layer, a hole shielding layer and a buffer layer.

13. A process for preparing an organic light emitting device, comprising the steps of:
preparing a first electrode;
forming at least two organic material layers including a light emitting layer on the first electrode; and
forming a second electrode on the organic material layer,
wherein the step of forming the organic material layer comprises the step of forming at least one layer of a hole injecting layer, a hole transporting layer and a hole injecting and transporting layer,
wherein the step of forming the at least one hole injecting layer, hole transporting layer and hole injecting and transporting layer comprises the step of forming a layer using a material with a HOMO energy level of −4 eV or less and a material with a LUMO energy level of −4 eV or less,
wherein the material with a HOMO energy level of −4 eV or less and the material with a LUMO energy level of −4 eV or less are mixed in a ratio which leads to a higher drive voltage than the drive voltage in the case of each material alone, and
wherein the thickness of the layer comprising the material with a HOMO energy level of −4 eV or less and the material with a LUMO energy level of −4 eV or less is 10 nm to 60 nm.

14. The process for preparing an organic light emitting device according to claim 13, wherein the material with a HOMO energy level of −4 eV or less includes an organic material containing an amine group.

15. The process for preparing an organic light emitting device according to claim 13, wherein the material with a HOMO energy level of −4 eV or less has a HOMO energy level of −9 eV or more.

16. The process for preparing an organic light emitting device according to claim 13, wherein the material with a LUMO energy level of −4 eV or less has a LUMO energy level of −9 eV or more.

17. The process for preparing an organic light emitting device according to claim 13, wherein the material with a LUMO energy level of −4 eV or less includes at least one selected from the group consisting of 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalenetetracarboxylic dianhydride (NTCDA), fluorine-substituted NTCDA, cyano-substituted NTCDA, hexanitrile hexaazatriphenylene (HAT), and hexaazatriphenylene hexacarbonnitrile.

18. The process for preparing an organic light emitting device according to claim 13, wherein the step of forming a layer using the material with a HOMO energy level of −4 eV or less and a material with a LUMO energy level of −4 eV or less is carried out by spin coating, dip coating, doctor blading, screen printing, ink jet printing, or heat transfer processes.

* * * * *